United States Patent [19]

Edwards

[11] Patent Number: 5,066,889

[45] Date of Patent: Nov. 19, 1991

[54] SEALED LED LAMP HOUSING

[75] Inventor: Geoffrey S. Edwards, Grange-over-Sands, England

[73] Assignee: Oxley Developments Company Limited, Cumbria, England

[21] Appl. No.: 510,894

[22] Filed: Apr. 18, 1990

[30] Foreign Application Priority Data

Jul. 1, 1989 [GB] United Kingdom .................. 8915167

[51] Int. Cl.[5] ........................ H01L 23/13; H05B 33/02

[52] U.S. Cl. .................................... 313/512; 313/499; 362/800

[58] Field of Search .................. 313/499, 512; 357/17, 357/72, 74; 362/800

[56] References Cited

U.S. PATENT DOCUMENTS

| | | | |
|---|---|---|---|
| 2,750,654 | 7/1956 | Owens | 357/72 X |
| 3,178,621 | 4/1965 | Glickman | 357/72 X |
| 3,919,585 | 11/1975 | Schorr | 313/499 |

*Primary Examiner*—Sandra L. O'Shea
*Attorney, Agent, or Firm*—Staas & Halsey

[57] ABSTRACT

A sealed LED lamp housing includes a single unit made of a semi-transparent polymer of neutral optical density having a first portion forming a lens, through which light can pass from an LED contained therein, and a second portion, of greater thickness than the first portion, that provides a contrast annulus surrounding the lens.

3 Claims, 1 Drawing Sheet

SEALED LED LAMP HOUSING

BACKGROUND OF THE INVENTION

The present invention relates to a sealed LED lamp housing.

In some applications, panel indicator lamps that use light emitting diodes (LEDs) may require panel sealing against the ingress of moisture or other contaminants into the equipment, and internal sealing to protect the LED inside the lamp. In addition, there is the requirement to achieve economical manufacture, coupled with the need for sunlight visibility and environmentally protected optics, typically those using infra-red (IR) blocking filters as used in lamps in situations where they are required to be less detectable by night vision (IR sensitive) surveillance equipment.

A number of devices are known for achieving the desired characteristics, see for example British Patent Nos. 1518305, 1530304 and British Patent Application No. 2203903, each of the Oxley Developments Co. Ltd.

SUMMARY OF THE INVENTION

It is an object of the present invention to provide a sealed LED lamp housing which is further improved compared to the known devices.

In accordance with the present invention, a sealed LED lamp housing includes a single unit made of a semi-transparent polymer having a first portion forming a lens, through which light can pass from an LED contained therein, and a second portion, of greater thickness than the first portion, that provides a contrast annulus surrounding said lens.

Preferably, the semi-transparent polymer is of neutral optical density, i.e. grey, so that the transparency is directly related to the thickness of the polymer.

Preferably, the single piece unit includes a threaded tubular portion.

Preferably, there is a matt surface finish on said annulus for scattering ambient light incident thereon.

By use of the present invention, it is possible to achieve an easily moldable case and to obtain the flexibilty of obtaining different optical arrangements without affecting the sealing of the lamp.

BRIEF DESCRIPTION OF THE DRAWINGS

The invention is described further hereinafter, by way of example only, with reference to the accompanying drawing which is a sectional view of one embodiment of an LED having a sealed lamp housing according to the present invention.

DESCRIPTION OF THE PREFERRED EMBODIMENTS

Figure 1:
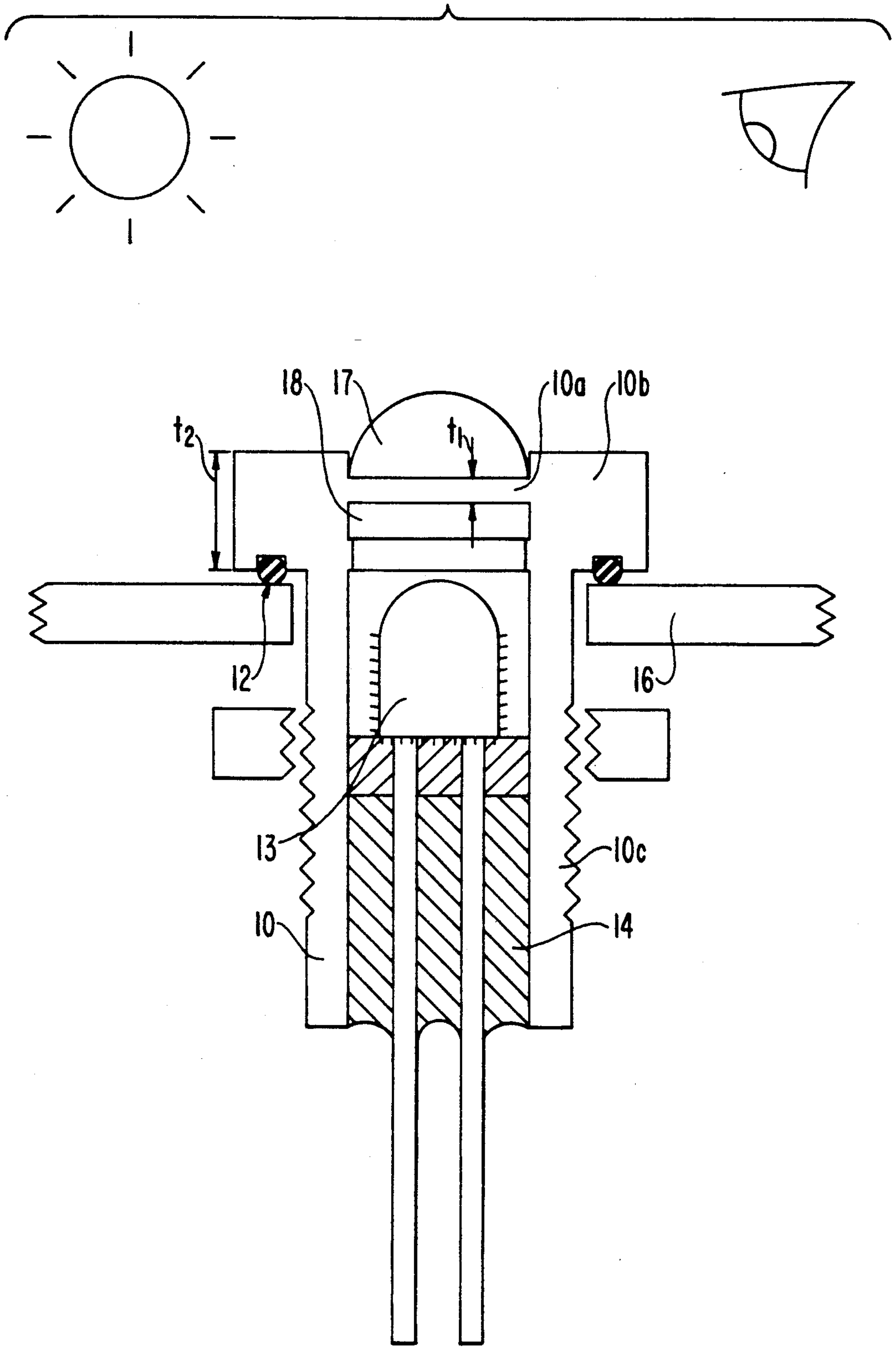

In the illustrated embodiment, LED 13 is encased by encapsulation 14 and a plastic molded casing 10 which, from the optical point of view, has two principal parts, a thin portion forming a lens 10a through which light from the LED passes, and a thicker portion or contrast annulus 10b (considered in the direction of the longitudinal axis of the assembly), which provides the contrast annulus around the lens portion 10a. In the drawing the thickness of the portion 10a is denoted by $t_1$ and the thickness of the portion 10b by $t_2$.

Portions 10a, 10b and the rest of the casing 10, including a threaded tubular portion 10c, constitute a single piece molding.

The different optical characteristics for the two portions 10a, 10b of the casing 10 are provided by forming the casing 10 from a polymer which is semi-transparent and of neutral optical density, i.e. grey. Thus, the different thicknesses of portions 10a and 10b provide the required transparency for the lens 10a and the black absorbancy of the contrast annulus 10b, respectively.

Use of a neutral density lens 10a enhances the on/off contrast ratio. Ambient sunlight that passes through the lens 10a a first time, is reflected from the inside of the lamp to pass through the lens 10a a second time, thus being attenuated, in total, by the square of the attenuating factor x of the lens 10a (i.e. $x^2$). Light from the LED, however, passes through the lens only once and is therefore only attenuated by a factor of x. Ambient sunlight competing with LED illumination is thus reduced and the contrast ratio accordingly increased by a factor of approximately 1/x. This can be explained in that, suppose that sunlight (L1) enters the lamp and passes the lens 10a twice (assuming perfect conditions) so that on leaving the lamp it is reduced to $$\frac{L1}{x}.$$

The contrast ratio without filter $$\left(\frac{L2}{L1}\right)$$

is thus reduced to $$\frac{L2x}{L1x^2} \text{ i.e. by } \frac{1}{x} \; (x \text{ being } < 1).$$

Further increases in contrast ratio are also achieved in practice by absorbing the sunlight within the lamp by the use of blackened internal surfaces.

The sealing of the case to a panel 16 is effected by an O-ring 12, and the other optical elements (as used conventionally in devices of this type) in either plastic or glass are conveniently located at 17 (convex filter) and 18 (filter disc), by suitable indentations in the casing 10. The casing 10 is preferably made of material such as to be environmentally resistant against solvent and moisture, for instance.

A smooth, matt surface finish to annulus 10b may be provided so as to prevent spurious scattering of light and to promote the efficient transmission of light from the LED 13.

Ambient light entering the lamp body is also quenched by grey plastic to minimize reflective and light scattering, and thus also reduce its competition with light from the LED.

I claim:

1. A sealed LED lamp housing, comprising:
   - (a) a unitary housing member made of a semi-transparent polymer of neutral optical density;
   - (b) the unitary housing member has a first, elongate, cylindrical portion defining an internal cylindrical cavity which receives the LED therewithin;
   - (c) the unitary housing member has a second portion forming a cylindrical lens located in front of the LED and disposed in said cylindrical cavity;
   - (d) the unitary housing member has a third, annular portion which is coaxial with the first portion and laterally surrounds the second portion;

(e) the third portion is of greater thickness than the second portion relative to the axial direction of the first, cylindrical portion, so as to provide a contrast annulus surrounding the second portion;

(f) the third portion is of greater diameter than the first cylindrical portion so that the third portion overlaps the first portion; and (g) means for sealing between said overlap and an external apparatus receiving said housing.

2. The housing according to claim 1, wherein said first portion comprises an external screw-thread.

3. The housing according to claim 1, wherein said third portion has a matt surface finish for scattering ambient light incident thereon.

* * * * *